United States Patent
Poechmueller

(10) Patent No.: US 7,061,408 B2
(45) Date of Patent: Jun. 13, 2006

(54) CONCEPT FOR A SECURE DATA COMMUNICATION BETWEEN ELECTRONIC DEVICES

(75) Inventor: Peter Poechmueller, Unterhaching (DE)

(73) Assignee: Infineon Technologies AG, Munich (DE)

( * ) Notice: Subject to any disclaimer, the term of this patent is extended or adjusted under 35 U.S.C. 154(b) by 37 days.

(21) Appl. No.: 10/802,267

(22) Filed: Mar. 17, 2004

(65) Prior Publication Data

US 2004/0225945 A1 Nov. 11, 2004

Related U.S. Application Data

(63) Continuation of application No. PCT/EP02/08091, filed on Jul. 19, 2002.

(30) Foreign Application Priority Data

Sep. 17, 2001 (DE) ................................ 101 45 722

(51) Int. Cl.
*H03M 7/00* (2006.01)
(52) U.S. Cl. ............................ 341/55; 341/50; 710/65
(58) Field of Classification Search ................ 341/50, 341/55; 710/65, 124
See application file for complete search history.

(56) References Cited

U.S. PATENT DOCUMENTS

| 5,781,129 A | 7/1998 | Schwartz et al. |
| 5,931,927 A * | 8/1999 | Takashima ................... 710/65 |
| 6,243,779 B1 * | 6/2001 | Devanney et al. .......... 710/305 |
| 6,538,584 B1 * | 3/2003 | Borkar et al. ................. 341/58 |
| 6,584,526 B1 * | 6/2003 | Bogin et al. ................ 710/124 |

FOREIGN PATENT DOCUMENTS

WO WO 97/13347 4/1997

OTHER PUBLICATIONS

Nakamura, K. et al.; A 500-MHz 4-Mb CMOS pipeline-burst cache SRAM with point-to-point noise reduction coding I/O; IEEE Journal of Solid State Circuits, vol. 32, No. 11, Nov. 1997, pp. 1758-1765.*

(Continued)

*Primary Examiner*—Howard L. Williams
(74) *Attorney, Agent, or Firm*—Slater & Matsil, L.L.P.

(57) ABSTRACT

An encoder for encoding a data word with a plurality of bits, wherein the data word is transmittable in parallel on a data bus, wherein one bit line is provided for each bit and wherein each bit may have one of two logical states, including a means for examining the data word in order to determine whether a first number of bits of the data word with a first logical state deviates from a second number of bits of the data word with a second logical state by more than a predetermined threshold, a means for changing the state of a bit of the data word in order to create an encoded data word in case the predetermined threshold is exceeded by the data word, and a means for detecting auxiliary information referring to the changed bit.

27 Claims, 1 Drawing Sheet

OTHER PUBLICATIONS

Stan, M. et al.; Bus-Invert Coding for Low Power I/O; IEEE Transactions on Very Large Scale Integration (VLSI) Systems; vol. 3, No. 1, Mar. 1995, pp. 49-58.*

Hronik, S., "The Myth of Ground Bounce Measurements and Comparisons," Integrated Device Technology, Inc. 1996, pp. 89-98.

Favalli, M., et al., "Optimization of error detecting codes for the detection of crosstalk originated errors", Proceedings Design, Automation and Test in Europe, Conference and Exhibition 2001, Proceedings Design, Automation and Test in Europe, Munich, Germany, Mar. 13-16, 2001, XP10538206, pp. 290-296.

Victor, B., "Data Encoding to Prevent Crosstalk Delay", Feb. 27, 2001, XP2245243, pp. 1-64, originally published on the internet.

Hronik, S., "The Myth of Ground Bounce Measurements and Comparisons," Integrated Device Technology, Inc. 1996, pp. 89-98, no month.

* cited by examiner

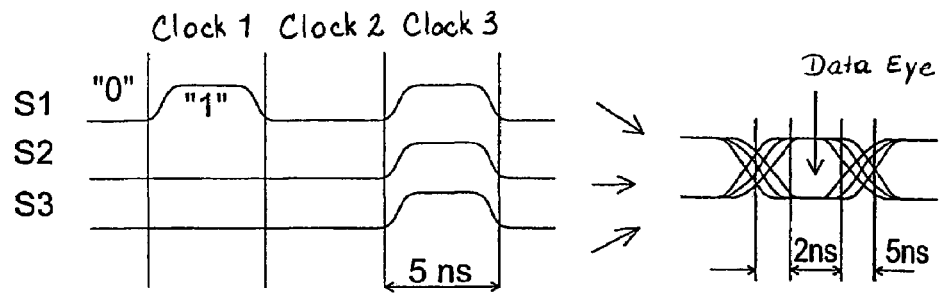
FIG 1A
FIG 1B
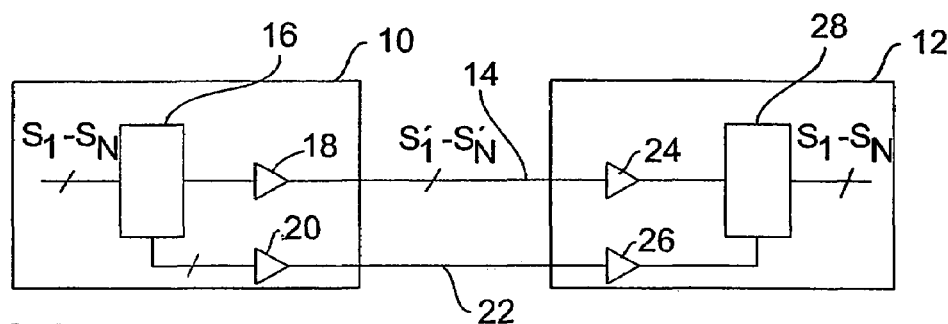
FIG 2
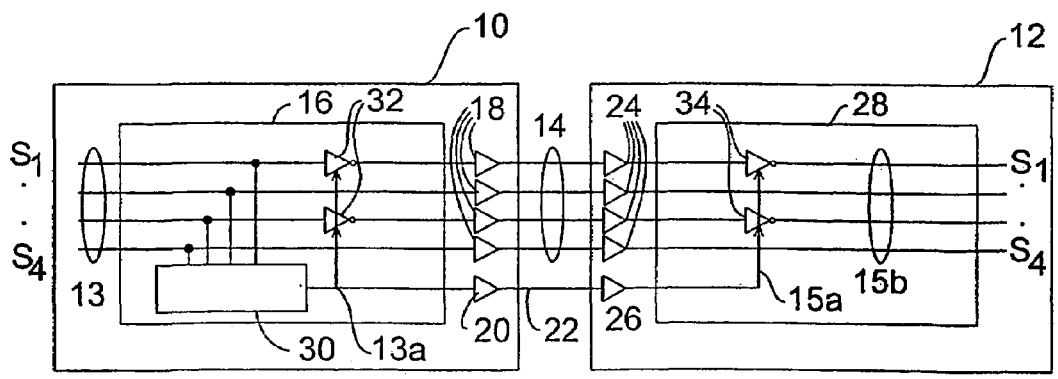
FIG 3

CONCEPT FOR A SECURE DATA COMMUNICATION BETWEEN ELECTRONIC DEVICES

CROSS-REFERENCE TO RELATED APPLICATIONS

This application is a continuation of co-pending International Application No. PCT/EP 02/08091, filed Jul. 19, 2002, which designated the United States and was not published in English, which is based on German Application No. 101 45 722.7, filed Sep. 17, 2001.

TECHNICAL FIELD

The present invention generally relates to a data communication between electronic components and in particular to a concept in order to securely and reliably guarantee a data communication between electronic components over a data bus also with high clock frequencies.

BACKGROUND

In today's electronic systems, like for example in a computer system, especially the memory system and the linking structures, i.e. the data buses, over which the electronic devices communicate with the additional devices, like for example with memory devices, are of great importance as they determine the capacity of overall electronic systems to a high extent. An important performance feature of data buses hereby is the transmission rate with which the data signals are transmitted over the data buses between the communicating electronic devices. Here, the maximum transmission rate results from the bus clock frequency, the number of bus clocks per data transfer and the number of bytes transmitted per transfer corresponding to the bus width. An increase of performance of the data transmission via a data bus is therefore generally achieved by increasing the bus clock frequency or by an increase of the bus width.

Thus, for example with DRAMs (Dynamic Random Access Memory) the bus clock frequency for the data bus has been increased from about 20 MHz to 400 MHz during the last seven years (up to 2001). This is why it will be increasingly important with faster and more complex electronic systems in the future that the individual system components and devices are capable of communicating safely and reliably with each other with ever higher frequencies and over increasingly wider data buses.

In order to explain the problems of data communication over a parallel data bus reference is made to FIG. 1a now, wherein different bit and/or data signals S1–S3 which are transmitted between two electronic devices via a parallel data bus are illustrated over a period of three clock cycles. As it is illustrated in FIG. 1a in the first clock cycle only one of the data signals, i.e. the signal S1, changes its state from a logical value "0" to a logical value "1", whereas in the third clock cycle all three data signals S1–S3 simultaneously change from the logical value "0" to the logical signal value "1".

If a majority of the signal values simultaneously changes from one data word to the next it may be observed in a data transmission over a data bus in practice that different delays in the rise time of the individual signal edges of the data signals occur on the individual bus lines of the data bus. The reason for these different delays and/or signal changes in the signal form is mainly that like in the last case illustrated in FIG. 1 numerous signal values (here all signal values) are simultaneously switched into the same direction, so that particularly much current needs to be made available by the electronic devices for supplying the associated output driver for the individual bus lines of the data buses. This, however, leads to voltage drops of the supply voltage in the electronic device due to unavoidable parasitic effects, like for example line path resistances and inductivities, due to which the output signal of the same and therefore the data signal of the sending electronic device to be transmitted may be largely affected.

FIG. 1b now shows an illustration that theoretically results when numerous single clock signal values of a plurality of signals are illustrated superimposed on each other over a plurality of clock cycles that are operated using random data. From this "superimposition" illustrated in FIG. 1b a so called "data eye" results. This resulting data eye is now an indicator for the signal quality in data transmission, i.e. the resulting data eye indicates in which period of time referring to the clock cycle all signal values transmitted over the data bus are stable, i.e. in which period of time an electronic device receiving the data is able to evaluate the input signals at its inputs, as otherwise a false signal value might be read out and/or interpreted. Thus, the resulting data eye should "ideally" be a rectangle, i.e. represent the ideal rectangled form of the data signals to be transmitted.

In the "real" example illustrated in FIG. 1a and 1b a clock cycle comprises 5 ns, wherein however the resulting data eye may be reduced to an effective width of for example a width of about 2 ns which is finally available for a data interpretation of the transmitted signal data due to the above described interfering effect.

This represents an increasing problem especially for complex electronic systems expected in the future, as with higher clock frequencies and with greater bus widths the resulting data eye may disappear completely, so that no reliable signal transmission between two electronic devices over the data bus is possibly anymore. This finally leads to the fact that a desired and necessary increase of the clock cycle and the bit width of the data signals can not be realised anymore for future electronic systems due to the mentioned problems and therefore the system limits of electronic systems will soon be reached.

Apart from that it has to be noted that the resulting data eye in an electronic system is further reduced by effects like signal line couplings, design asymmetries on the transmitter and receiver side, etc. Therefore, these effects in the electronic system further contribute to an impairment of the data transmission.

As it was illustrated above, the basic component which leads to a decrease of the effective width of the resulting data eye in a data transmission is mainly the simultaneous switching of identical signal values which leads to internal supply voltage drops in the electronic devices communicating with each other. This effect is called synchronous switching noise "SSN" in the following.

Up to now the synchronous switching noise SSN was only fought by general switching measures by providing voltage supplies, which are independent from each other and as good as possible, of the individual output signal drivers of the electronic devices on an electronic semiconductor device. However, these methods meanwhile reach their technical limits and can momentarily not be improved anymore and/or only with very high costs.

SUMMARY

In one aspect, the present invention provides a concept for a secure and a reliable data communication between electronic devices.

In accordance with a first aspect, the invention provides an encoder for encoding a data word having a plurality of bits, wherein the data word is transmittable in parallel on a data bus, wherein for each bit a bus line is provided and wherein each bit may have one of two states, having: a means for examining the data word in order to determine whether a first number of bits of the data word with a first logical state deviates from a second number of bits of the data word with a second logical state by more than a predetermined threshold; a means for changing the state of a bit of the data word in order to create an encoded data word if the predetermined threshold is exceeded by the data word; and a means for creating auxiliary information referring to the changed bit.

In accordance with a second aspect, the invention provides an encoder for encoding a data word having a plurality of bits, wherein the data word is transmittable in parallel on a data bus, wherein a bus line is provided for each bit and wherein each bit may have one of two logical states, having: a means for comparing the data word to a preceding data word in order to determine whether the number of transitions between the two states of each bit of the data word and the preceding data word exceeds a predetermined threshold; a means for changing the state of a bit of the data word in order to create an encoded data word if the predetermined threshold is exceeded by the data word; and a means for creating auxiliary information referring to the changed bit.

In accordance with a third aspect, the invention provides a decoder for decoding an encoded data word having a plurality of bits, wherein the encoded data word is transmittable on a data bus, wherein a bus line is provided for each bit and wherein each bit may have one of two states, having: a means for receiving the encoded data word, wherein the state of a bit of the encoded data word is changed; a means for receiving auxiliary information referring to the changed bit of the data word; and a means for changing the encoded data word based on the auxiliary information in order to create a decoded data word.

In accordance with a fourth aspect, the invention provides a method for encoding a data word having a plurality of bits, wherein the data word is transmittable in parallel on a data bus, wherein a bus line is provided for each bit and wherein each bit may have one of two states, the method including the following steps: examining the data word in order to determine whether a number of bits of the data word having a first logical state deviates from a second number of bits of the data word having a second logical state by more than a predetermined threshold; changing the state of a bit of the data word in order to create an encoded data word if the predetermined threshold is exceeded by the data word; and creating auxiliary information referring to the changed bit.

In accordance with a fifth aspect, the invention provides a method for encoding a data word with a plurality of bits, wherein the data word is transmittable in parallel on a data bus, wherein one bus line is provided for each bit and wherein each bit may have one of two logical states, the method including the following steps: comparing the data word to a preceding data word to determine whether the number of transitions between the two states of each bit of the data word and the preceding data word exceeds a predetermined threshold; changing the state of a bit of the data word in order to create an encoded data word if the predetermined threshold is exceeded by the data word; and creating auxiliary information referring to the changed bit.

In accordance with a sixth aspect, the invention provides a method for decoding an encoded data word having a plurality of bits, wherein the encoded data word is transmittable on a data bus, wherein a bus line is provided for each bit and wherein each bit may have one of two states, the method including the following steps: receiving the encoded data word, wherein the state of a bit of the encoded data word is changed; receiving auxiliary information referring to the changed bit of the data word; and changing the encoded data word based on the auxiliary information in order to create a decoded data word.

The preferred embodiment of the present invention is based on the findings that the data transmission between two electronic semiconductor devices communicating with each other over a data bus may be accomplished securely with high clock frequencies by performing a specific and explicit change, i.e. encoding of the data signals on the transmitter side, that is on the transmitting electronic semiconductor device, so that the negative effects during data transmission, like for example internal supply voltage drops due to the simultaneous switching of a high number of identical signal values may be avoided or only appear in a clearly reduced form. At that time also so called auxiliary information is produced by the encoder associated with the transmitter device, which refer to the change(s) of the encoded data signal compared to the original data signal. The encoded data signal and the auxiliary information are now transmitted to the received electronic semiconductor device that decodes the encoded data signals into the original data signals using the auxiliary information that was also transmitted. Thereby a secure data transmission is ensured via the respective data buses also with high clock frequencies and with a great bit width of the data word.

One principle of the present invention consequently is that with an electronic system including a transmitter and a receiver device communicating with each other over a data bus having a specific bit width, an encoder is provided in the transmitter device and a respective decoder is provided in the receiver device for reducing the synchronous switching noise SSN. It is now the task of the encoder to perform a recoding of the data words to be transmitted, so that a reduction of the synchronous switching noise SSN results when the data word appears which leads to an increase of the synchronous switching noise SSN. The receiver device may for example be informed about the encoding via an additional data line, i.e. auxiliary information regarding the encoded data word is transmitted referring to the encoding of the data word. With the help of this auxiliary information a decoding to the original data word may be accomplished by the decoder associated with the receiver device.

One possible realization of the present invention now is that an encoder is associated with the transmitting electronic device that is able to encode a data word to be transmitted in parallel on a data bus. The encoder thereby examines the data word in order to determine whether the actually present data word to be transmitted comprises a great number of bits comprising the same states, i.e. whether the data word to be transmitted comprises a high number of logical "0" or "1" states, so that a problem may occur in so far, that a too high number of identical signal values needs to be switched over simultaneously for the data word during the transmission. In order to avoid this the encoder changes one bit or several bits of a data word in order to create an encoded data word so that the number of bits having the same states falls below a predetermined threshold guaranteeing a secure transmission of the data word over the data bus. The encoder further creates so called auxiliary information containing information regarding the change(s) of the encoded data word with respect to the original data word, wherein this auxiliary information is transmitted with the encoded data word, so that a decoder within the received electronic semiconductor device may retrieve the original data word considering the auxiliary information after receiving the encoded data word.

A simple, practical arrangement for reducing the synchronous switching noise SSN for the inventive encoder and/or decoder arrangement is now, that a comparator means recognises, whether a data word having a great number of equal signal values is to be transmitted, for example, whether a large part of all signal values is logically "1" or "0". In this case, for example, programmable inverters are activated by the comparator means, which invert the signal value applied to the signal line before supplying it to the output drivers of the transmitter device. For the case that the distribution of signal values in the data words to be transmitted makes a transmission of the data word possible without problems, the driver means let the input signals, i.e. the data words, pass without a change.

The decoder may now decode the received encoded signal values within the receiver device into the original data word considering the auxiliary information that was also transmitted. Thereby, for example, the comparator means within the encoder is directly connected to respective inverters within the decoder in order to perform a decoding of the data word by an activation of the respective inverters within the decoder in order to receive the original data word again.

A further inventive implementation for an encoder for encoding a data word to be transmitted in parallel over a data bus according to the invention is, that the encoder compares the data word to be transmitted to a preceding data word, i.e. to the data word transmitted directly before the same, in order to determine whether the number of simultaneous switching actions of identical signal values between the data word still to be transmitted and the preceding data word exceeds a predetermined threshold for a secure data transmission. If this predetermined threshold is exceeded by the data word to be transmitted, the encoder changes the data word to be transmitted in order to create an encoded data word, which may be transmitted to the received electronic semiconductor device without problems. If the predetermined threshold is not exceeded by the data word to be transmitted, the data word is transmitted unchanged.

Also here the encoder creates auxiliary information that refer to the changes within the encoded data word, so that the encoded data word may be decoded into the original data word again using the auxiliary information within the decoder which is associated with the received electronic semiconductor device. Also in this case inverters may for example be used for changing the signal values of the data word.

Of course, also very complicated and complex arrangements may be used which compare the last transmitted data word to the next data word to be transmitted and perform a very complicated and/or complex encoding of the data word to be transmitted based on this information, in order to reduce the synchronous switching noise SSN at maximum. In this context the data line using which the additional information is transmitted may also be a complicated data bus to make complex decoder information available for the decoder. A data line for transmitting the encoder information may, however, also be part of the data bus itself.

Additionally, it is further possible to encode the auxiliary information directly into the encoded data words to be transmitted, wherein the decoder itself recognises at the receive side when and in which form a decoding needs to be performed.

The concept for a secure data communication between electronic devices therefore allows a reliable data communication between the individual electronic devices even with continuously increasing clock frequencies and ever greater bus widths in future electronic systems, which communicate with each other over a data bus, wherein the inventive concept is especially suitable for memory devices for a fast and reliable reading in and out of memory information.

Therefore, a limitation of the system frequency due to the synchronous switching noise SSN in data transmission via data buses expected in several years may be avoided using the present invention by specifically and explicitly changing the data signals to be transmitted, so that a synchronous switching noise SSN and also other negative effects on the data signal to be transmitted may be suppressed to a great extent.

BRIEF DESCRIPTION OF THE DRAWINGS

In the following, preferred embodiments of the present invention are specified referring to the accompanying drawings, in which FIG. 1a shows different signal data S1–S3 of subsequent data words over a time period of three clock cycles;

FIG. 1b shows a so called "data eye" resulting from a superimposed illustration of a plurality of signal data;

FIG. 2 shows a general, basic encoder/decoder arrangement according to the present invention; and FIG. 3 shows an encoder/decoder arrangement according to a first embodiment of the present invention.

DETAILED DESCRIPTION OF ILLUSTRATIVE EMBODIMENTS

Referring to FIG. 2 now a general principal embodiment of the inventive encoder/decoder concept for a secure data communication over a data bus between two electronic semiconductor devices is discussed in order to reduce the so called synchronous switching noise SSN within a data signal to be transmitted.

As discussed above, especially the synchronous switching noise causes a resulting "data eye" having a reduced width, wherein the data eye is an indicator in which period of time referring to the clock cycle all signal values transmitted over the data bus are stable, i.e. in which period of time an electronic device receiving the data can evaluate the input signals at its inputs, as otherwise a wrong signal value may be read out and/or interpreted. The form and width of the resulting data eye (comp. FIG. 1b) therefore states the transmission quality, i.e. how data signals transmitted over the data bus may be resolved at the receiver device.

Referring to FIG. 2 a first electronic semiconductor device 10 is illustrated which is in the following referred to as transmitter device 10, and a second electronic semiconductor device 12, which is in the following referred to as receiver device 12. The two electronic semiconductor devices 10, 12 communicate over a parallel data bus 14 having a predetermined bit width. The transmitter device 10 comprises an encoder 16 to which the signal data $S_1$–$S_N$, to be output by the transmitter device 10 are supplied.

The output of the encoder 16 is connected to a driver means 18 of the transmitter device 10, which forms the output of the transmitter device 10. The driver means 18 includes a plurality of signal drivers, wherein one signal driver is provided for every signal line of the data bus 16. The driver means 18 is provided to drive the signal data output by the encoder 16 on the data bus 14 to the receiver device 12.

The signal data $S_1$–$S_N$, wherein the index N states the bit width of the data word that is to be transmitted from the transmitter device 10 to the receiver device 12 over the data bus 14, are made available to the encoder 16 by the transmitter device 10. The data word to be transmitted in parallel on the data bus 14 thereby comprises a plurality of bits (N bits), wherein for every bit of the data word an individual bus line of the data bus 14 is provided. Every bit of a data word may have one of two logical states, wherein these logical states are complementary to each other, i.e. logical "0" or logical "1", respectively.

The transmitter device 10 further comprises a further driver means 20 on the output side that is provided in order to transmit help or encoder information of the encoder 16 on an additional data line 22 to the receiver device 12. The receiver device 12 comprises a receive driver means 24 on the input side connected to the data bus 14 in order to receive the signal data transmitted on the data bus 14, wherein one signal driver is provided for every signal line of the data bus. The receiver device 12 further includes an additional receive driver means 26 which is provided in order to receive the encoder information transmitted on the data line 22. The receiver device 12 includes a decoder 28, wherein its input is connected to the receive driver means 24, 26. The decoder 28 provides the decoded signal data $S_1$–$S_N$ on the output side.

In the following, a first embodiment of the inventive concept for a secure data communication between two electronic devices using an encoder in the transmitter device and a decoder in the receiver device is illustrated.

The encoder 16 of the transmitter device 10 examines the data word to be transmitted, i.e. the signal data $S_1$–$S_N$, in order to determine, whether an increased synchronous switching noise SSN may occur during the transmission of this data word. This is accomplished by detecting how many bits of the data word to be transmitted comprise a first logical state and a second logical state. If it is determined that relatively many equal logical states, i.e. very many "0" values or very many "1" values are present in the data word to be transmitted, this may lead to a plurality of simultaneous switching actions of identical signal values in the transmission of the data word, which may lead to the synchronous switching noise SSN and therefore to the resulting "data eye" with a reduced effective width which was already explained in detail referring to FIG. 1, due to internal supply voltage drops of the driver means 18, 20.

To this end, a predetermined threshold is given in the encoder 16 which states by which value a number of bits of the data word having a predetermined state may deviate from a second number of bits of the data word having a second state, i.e. by which value the number of logical "1" values may differentiate from the number of logical "0" values of the signal data of the respective data word in order to guarantee a secure and reliable data transmission over a data bus between different electronic devices.

The predetermined threshold thereby is a preset ratio between the first number of bits of the data word with a first logical state and the second number of bits of the data word with a second logical state. The preset ratio is selected in practice in order to receive a resulting data eye depending on the bit width of the data word and the bus clock frequency, which guarantees a secure and reliable evaluation of the transmitted signal data. For the preset ratio between the data values to be transmitted, i.e. between the logical "0" and "1" values of the data word therefore arbitrary values (2:1, 3:1, . . . and also intermediate values of the same) may be selected depending on the respective electronic devices.

If the predetermined threshold is exceeded by the signal data $S_1$–$S_N$ of the data word to be transmitted, i.e. if it is to be expected that a too large number of identical signal values needs to be switched over simultaneously with this data word, then the encoder 16 performs a change of state of at least one bit of the data word in order to receive an encoded data word which falls below the predetermined threshold, so that in the transmission a generally decreased synchronous switching noise SSN is obtained. Should the data word to be transmitted not exceed the predetermined threshold, then the data word is transmitted over the data bus 14 without a change.

In order to be able to decode the encoded data word within the decoder 28 associated with the receiver device 12 again, the encoder 16 further creates so called auxiliary information, which refer to the changes carried out within the data word. This auxiliary information is for example transmitted over the additional data line 22 to the decoder 28 associated with the receiver device 12.

The decoder 28, which is associated with the receiver device 12, is now provided with the encoded data word and the auxiliary information associated with the encoded data word. Using the auxiliary information the decoder 28 now decodes the encoded data word into the original data word. Same is provided at the output of the decoder 28 within the receiver device 12.

The principle of this embodiment of the present invention may thus be summarised as follows. A transmitter device 10 and a receiver device 12 communicate over a data bus 14 having a predetermined bit width, which corresponds to the bit width of a data word to be transmitted. For reducing the above discussed synchronous switching noise SSN and/or also other negative influences on the data words to be transmitted, the data word is encoded, wherein in the transmitter device 10 an encoder 16 is provided and within the receiver device 12 a corresponding decoder 28 is provided. The encoder 16 in the transmitter device 10 carries out a recoding of the data word to be transmitted when a data word to be transmitted appears which leads to an increased synchronous switching noise SSN, so that in the transmission of the data word a reduction of the synchronous switching noise results. The receiver device 12 and therefore the decoder 28 may be informed about the encoding information for example over an additional data line 22. Hereby a decoding of the encoded data word into the original data word may be performed by the decoder 28.

Referring to FIG. 3 now a simple practical realisation of the above embodiment for the inventive encoder/decoder concept for a secure data communication between two electronic semiconductor devices 10, 12 is discussed.

As it is shown in FIG. 3 internal data lines 13 of the transmitter device 10 are connected to the encoder 16, wherein the data word to be transmitted is provided to the input of the encoder 16 with the signal data $S_1$–$S_4$. For reasons of clarity of the description reference is made to a four-bit wide data word in FIG. 3.

In this embodiment the encoder 16 includes a comparator 30 connected to the individual internal data lines 13 of the transmitter device 10 at the input side. Within the internal data lines 13 further inverter 32 are connected, wherein the control terminals are connected to the output of the comparator 30. The output of the comparator 30 is further connected to the data line 22 over a signal driver 20.

In the example illustrated in FIG. 3 four internal signal lines 13 are provided, wherein in two signal lines one inverter 32 each is connected. The individual internal data lines 13 of the transmitter device 10 are connected to signal drivers 18 at the output side in order to transmit the data word to be transmitted on the data bus 14 to the receiver device 12. The output of the comparator 30 is further connected to an additional internal data line 13a connected to the driver means 20 of the transmitter device 10 in order to transmit the output signal, i.e. the auxiliary information, of the comparator 30 over the data line 22 to the receiver device 12.

The data bus 14 is connected to receive drivers 24 at the input side of the receiver device 12, wherein the additional data line 22 is connected to a further receive driver 26 at the input side of the receiver device 12. The receive drivers 24 of the receiver device 12 are connected to the internal signal lines 15 of the receiver device 12. The additional receive driver 26 of the receiver device 12 is connected to a further internal data line 15a of the receiver device 12. The decoder 28 of the receiver device 12 comprises inverters 34 which are connected with the corresponding internal data line 13. The control inputs of the inverters 34 are connected to the additional internal data line 15b.

In the following, the functioning of the inventive encoder/decoder arrangement illustrated in FIG. 3 for a secure data communication between two electronic semiconductor devices is specified.

In the case illustrated in FIG. 3 the encoder 16 of the transmitter device 10 includes a comparator, which detects and/or compares the signal states of the signal data $S_1$–$S_4$ of the data word to be transmitted to each other. This comparator 30 recognizes whether a large number of equal signal data, i.e. with equal logical states, is to be transmitted. If the comparator 30 determines, that the data word to be transmitted comprises a large number of bits having the same state, i.e. that a first number of bits of the data word with a first state deviates from a second number of bits of the data word with a second state by more than a predetermined threshold, which may lead to an increased synchronous switching noise SSN in the transmission of the data word, then the comparator activates at least one inverter, which is switched into an internal data line 13, so that the data word falls below a predetermined threshold. Thereby at least one signal data value of the data word is changed in order to reduce the interfering synchronous switching noise SSN.

In this case programmable inverter 32 are activated by the comparator 30, which would otherwise let the signal data pass unchanged, if the predetermined threshold is not exceeded.

The number of inverters is thereby dependent on the bit width of the data word and therefore the width of the data bus is selected so that a sufficient number of signal data $S_1$–$S_4$ may be changed in order to effectively reduce and/or avoid the synchronous switching noise SSN, i.e. by changing the signal data the simultaneous switching over of identical signal values is reduced in order to reduce internal supply voltage drops. It is for example possible to provide as many inverters that after an encoding there is always a ratio possible between the logical signal states ("0", "1") of the data word of about 1:1, wherein for this at maximum one inverter is necessary for every second signal line.

This changed and/or encoded data word $S'_1$–$S'_4$ is now transmitted to the receiver device 12 over the data bus 14. Further, the comparator 30 creates auxiliary information which state which signal data were changed. This auxiliary information is transmitted to the receiver device 12 over an additional data line 22 and therefore to the decoder 28.

According to the auxiliary information created by the comparator 30 which is transmitted to the decoder 28, the decoder 28 decodes the received, encoded data word using the changed signal data in such a way, that the decoder changes the corresponding signal data back again using the inverter 34, i.e. decodes the same. At the output of the decoder 28 of the receiver device 12 therefore the original decoded data word is provided again.

The decoder 28 now uses this transmitted auxiliary information to activate corresponding inverters in turn, which are switched within its internal data bus 15b, so that the signal data of the data words changed (inverted) for the transmission are inverted again in order to provide the original data word again at the output of the decoder 28. Further it should be noted, that the inverter 34 switched within the internal data bus 15b of the decoder 28 are located at corresponding positions referring to the inverter 32 switched within the internal data bus 13 of the encoder 16.

In the case shown in FIG. 3 the control signal of the comparator 30 created within the encoder 16 for driving the inverters may also be used as the necessary auxiliary information, as the inverters within the decoder are located in "respective" signal lines within the encoder referring to the inverter.

In the arrangement illustrated in FIG. 3 the data bus 14 includes, for example, four signal lines in order to transmit a data word having a width of four bits. It is however understood, that the inventive encoder/decoder concept is also applicable to data buses having an arbitrary width. Depending on the bit width of the data bus 14 and therefore the bit width of the internal data buses 13, 15b, the number of inverters 32, 34 within the encoder 16 and/or the decoder 28 needs to be selected in order to be able to change a sufficiently large number of signal data values of the data word in order to reduce and/or avoid a synchronous switching noise SSN which might occur in the transmission of the data word.

Again referring to FIG. 2 a further embodiment of the inventive concept for a secure data communication between a first and a second electronic device is discussed.

The encoder 16 of the transmitter device 10 is in turn provided in order to encode a data word having a plurality of bits. The data word is transmittable in parallel on a data bus, wherein a bus line is provided for every bit of the data word. Every bit of the data word may have one of two complementary states, i.e. logical "0" or logical "1", respectively. According to this embodiment, the encoder 16 now compares the data word to be transmitted to the data word transmitted directly before. Thereby it is determined, whether the number of transitions between the two complementary states of each bit of the data word to be transmitted and the data word transmitted directly before exceeds a predetermined threshold which might lead to an increased synchronous switching noise SSN during the transmission of the data word. If the encoder 16 determines that this predetermined threshold is exceeded by the data word to be transmitted, the encoder 16 changes the state of one bit of the data word in order to create an encoded data word to be transmitted which reduces and/or avoids the occurrence of the synchronous switching noise SSN. Simultaneously, the encoder 16 creates auxiliary information referring to the encoding, which refer to the changes within the encoded data word.

This so called auxiliary information may for example be transmitted over a separated data line 22 to the decoder 28 of the receiver device 12, as in the above illustrated embodiment, wherein it is also possible to encode the auxiliary information directly into the encoded data word.

Using the transmitted auxiliary information provided separately to the encoder 28 of the receiver device or also encoded into the encoded data word, the decoder 28 may restore the original data word. Also in this embodiment inverters may be used for changing the signal values of the data word.

In this embodiment also complicated encoding methods may be used, however, so that the last transmitted data word is compared to the next data word to be transmitted, as it was mentioned above, and based on this information a complex and/or complicated encoding is accomplished in order to maximally reduce the synchronous switching noise. Hereby the data line 22 for transmitting the auxiliary information may also be a more complicated bus in order to make complex decoder information (auxiliary information) available for the decoder 28 of the receiver device 12.

It is to be noted that the data line 22 for transmitting the auxiliary information may also be part of the data bus 14, i.e. through the transmitted, encoded data word the decoder 28 realises when and in which form a decoding needs to be accomplished.

The concepts for a secure data communication between electronic semiconductor devices described above are especially suitable if the receiver device 12 is a memory device, for example a DRAM device. Using this a secure and reliable data communication may be guaranteed in future between memory devices and further electronic devices also in electronic systems, which will be ever more complex, also with high clock frequencies and high bit widths of the data bus.

While this invention has been described in terms of several preferred embodiments, there are alterations, permutations, and equivalents that fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An encoder for encoding a data word having a plurality of bits, wherein the data word is transmittable in parallel on a data bus, wherein for each bit a bus line is provided and wherein each bit may have one of two states, comprising:
   a means for examining the data word in order to determine whether a first number of bits of the data word with a first logical state or a second number of bits of the data word with a second logical state exceeds a predetermined threshold, the predetermined threshold being a value that is higher than 50% of the total number of bits of the data word;
   a means for changing the state of at least one bit of the data word from the number of bits exceeding the predetermined threshold in order to create an encoded data word if the predetermined threshold is exceeded by the data word, so that the first number of bits and the second number of bits of the encoded data word are below the predetermined threshold; and
   a means for creating auxiliary information referring to the at least one changed bit;
   wherein the means for changing has a number of programmable inverters, the number of the programmable inverters being at most 50% of the number of the bit lines.

2. The encoder according to claim 1, wherein the predetermined threshold is a preset ratio between the first number of bits of the data word having a first logical state and the second number of bits of the data word having a second logical state.

3. The encoder according to claim 1, wherein the two states that each bit of a data word are complementary logical states.

4. The encoder according to claim 1, wherein the encoder is connectable to a data bus.

5. The encoder according to claim 1, wherein for each bus line of the data bus a driver means is provided.

6. The encoder according to claim 1, wherein the means for examining the data word is a comparator means which compares the logical states of the data word.

7. The encoder according to claim 1, wherein the encoder comprises an inverter means in order to change the state of a bit of the data word.

8. The encoder according to claim 1, wherein the encoder is connectable to a data line in order to transmit the auxiliary information.

9. The encoder according to claim 8, wherein the data line is part of the data bus.

10. The encoder according to claim 1, wherein the encoder is part of an electric device that communicates with a memory device.

11. The encoder according to claim 1, wherein the means for changing is configured to change at least one bit and at most 50% of the bits of the data word.

12. An encoder for encoding a data word having a plurality of bits, wherein the data word is transmittable in parallel on a data bus, wherein a bus line is provided for each bit and wherein each bit may have one of two logical states, comprising:
    a means for comparing the data word to a preceding data word in order to determine whether the number of equal transitions between the two states of each bit of the data word and the preceding data word exceeds a predetermined threshold, the predetermined threshold being chosen to ensure a secure transmission of the data word when the number is below the predetermined threshold;
    a means for changing the state of at least one bit of the data word from the number of bits of the data word, due to which the predetermined threshold is exceeded, and at most 50% of the bits of the data word in order to create an encoded data word if the predetermined threshold is exceeded by the data word, so that the number of equal transitions between the two states of each bit of the encoded data word and the preceding data word is below the predetermined threshold; and
    a means for creating auxiliary information referring to the at least one changed bit;
    wherein the means for changing has a number of programmable inverters, the number of the programmable inverters being at most 50% of the number of the bit lines.

13. The encoder according to claim 12, wherein the predetermined threshold is a preset ratio between the first number of bits of the data word having a first logical state and the second number of bits of the data word having a second logical state.

14. The encoder according to claim 12, wherein the means for comparing the data word to a preceding data word evaluates the number of transitions from one state to the other.

15. The encoder according to claim 12, wherein the two states each bit of a data word may are complementary states.

16. The encoder according to claim 12, wherein the encoder is connectable to a data bus.

17. The encoder according to claim 12, wherein a driver means is provided for each bus line of the data bus.

18. The encoder according to claim 12, wherein the encoder comprises an inverter means in order to change the state of a bit of the data word.

19. The encoder according to claim 12, wherein the encoder is connectable to a data line in order to transmit the auxiliary information.

20. The encoder according to claim 19, wherein the data line is part of the data bus.

21. The encoder according to claim 12, wherein the auxiliary information is encoded into the encoded data word.

22. The encoder according to claim 12, wherein the encoder is part of an electric device communicating with a memory device.

23. An encoder for encoding a data word having a plurality of bits, wherein the data word is transmittable in parallel on a data bus, wherein for each bit a bus line is provided and wherein each bit may have one of two states, the encoder comprising:

a comparator including a plurality of inputs coupled to data lines to receive bits of the data word, the comparator also including an output for carrying a signal based upon a relationship of logical values of the bits of the data word, wherein the output of the comparator is for carrying a signal based on a determination of whether a first number of bits of the data word with a first logical state or a second number of bits of the data word with a second logical state exceeds a predetermined threshold;

a plurality of programmable inverters, each inverter having an input coupled to one of the data lines and a control input coupled to the output of the comparator, wherein the programmable inverters are configured for changing the state of at least one bit of the data word from the number of bits exceeding the predetermined threshold in order to create an encoded data word if the predetermined threshold is exceeded by the data word, so that the first number of bits and the second number of bits of the encoded data word are below the predetermined threshold, wherein the number of the programmable inverters is at most 50% of the number of the bit lines; and a plurality of output drivers, a first set of the output drivers having inputs coupled to the data lines and the remainder of the output drivers having inputs coupled to outputs of the programmable inverters.

24. The encoder of claim 23 wherein the predetermined threshold is a value that is higher than 50% and, preferably, higher than two thirds of the total number of bits of the data word.

25. The encoder of claim 24 wherein the predetermined threshold is chosen to ensure a secure transmission of the data word when the number is below the predetermined threshold.

26. The encoder of claim 23 wherein the predetermined threshold is chosen to ensure a secure transmission of the data word when the number is below the predetermined Threshold.

27. An encoder for encoding a data word having a plurality of bits, wherein the data word is transmittable in parallel on a data bus, wherein for each bit a bus line is provided and wherein each bit may have one of two states, the encoder comprising:

a comparator including a plurality of inputs coupled to data lines to receive bits of the data word, the comparator also including an output for carrying a signal based upon a relationship of logical values of the bits of the data word, wherein the output of the comparator is for carrying a signal based on a comparison of the data word to a preceding data word that determines whether the number of equal transitions between the two states of each bit of the data word and the preceding data word exceeds a predetermined threshold;

a plurality of programmable inverters, each inverter having an input coupled to one of the data lines and a control input coupled to the output of the comparator, wherein the programmable inverters are configured for changing the state of at least one bit of the data word from the number of bits exceeding the predetermined threshold and at most 50% of the bits of the data word in order to create an encoded data word if the predetermined threshold is exceeded by the data word, so that the number of equal transitions between the two states of each bit of the encoded data word and the preceding data word is below the predetermined threshold, wherein the number of programmable inverters is at most 50% of the number of the bit lines; and a plurality of output drivers, a first set of the output drivers having inputs coupled to the data lines and the remainder of the output drivers having inputs coupled to outputs of the programmable inverters.

* * * * *

UNITED STATES PATENT AND TRADEMARK OFFICE
CERTIFICATE OF CORRECTION

PATENT NO. : 7,061,408 B2  Page 1 of 1
APPLICATION NO. : 10/802267
DATED : June 13, 2006
INVENTOR(S) : Poechmueller It is certified that error appears in the above-identified patent and that said Letters Patent is hereby corrected as shown below:

Column 13, Claim 15, line 2: delete "may"
Column 14, Claim 26, line 14: delete "Threshold" insert --threshold--

Signed and Sealed this

Twenty-second Day of August, 2006

JON W. DUDAS
*Director of the United States Patent and Trademark Office*